United States Patent [19]

Sun et al.

[11] Patent Number: 5,270,291
[45] Date of Patent: Dec. 14, 1993

[54] METHOD OF REDUCING DECAY OF MAGNETIC SHIELDING CURRENT IN HIGH $T_c$ SUPERCONDUCTORS

[75] Inventors: Jonathan Z. Sun, Goleta; Theodore H. Geballe, Woodside; Bruce Lairson, Palo Alto, all of Calif.

[73] Assignee: The Board of Trustees of the Leland Stanford Junior University, Stanford, Calif.

[21] Appl. No.: 615,087

[22] Filed: Nov. 19, 1990

[51] Int. Cl.$^5$ .............................................. H01B 12/00
[52] U.S. Cl. ........................................ 505/1; 62/51.1; 505/726; 505/780
[58] Field of Search .................. 505/1, 725, 726, 727, 505/780; 62/51.1

[56] References Cited

U.S. PATENT DOCUMENTS

| | | | |
|---|---|---|---|
| 4,773,228 | 9/1988 | Murai et al. | 62/51.1 |
| 4,872,314 | 10/1989 | Asano et al. | 62/51.1 X |
| 4,982,571 | 1/1991 | Marchik et al. | 62/51.1 |

OTHER PUBLICATIONS

Yeh et al., "Persistant Current in Ba-Y-Cu-O in Liquid Nitrogen", Phys. Rev. B, vol. 36(4), pp. 2414-2416, Aug. 1, 1987.
Hamzic et al., "Non-Activated Magnetic Relaxation in a High-$T_c$ Superconductor", Nature, vol. 345, pp. 515-516, Jun. 7, 1990.
Ferguson et al., "Magnetic Measurements of Critical Currents in High $T_c$ Superconductors", Cryogenics, vol. 28, Oct. 1988.
Mohamed et al., "Decay of Trapped Flux in the High-$T_c$ Superconducting Compound $Y_1Ba_2Cu_3O_{6.5-\delta}$", Phys. Rev. B, vol. 37(10), Apr. 1988.
M. R. Beasley, R. Labusch, W. W. Webb, *Flux Creep in Type-II Superconductors*, Phys. Rev., vol. 181, No. 2, May 10, 1969, pp. 682-700.
Pool,. "Superconductivity: Is the Party Over?", Science, vol. 244, May 1989, pp. 914-916.
Shurkin, "Super-lasting Superconductors", Stanford Daily, Jan. 24, 1990.
Sun, et al., "Elimination of Current Dissipation in High Transition Temperature Superconductors", Science, vol. 247, Jan. 19, 1990, pp. 307-309.

*Primary Examiner*—Henry A. Bennett
*Assistant Examiner*—Christopher Kilner
*Attorney, Agent, or Firm*—Townsend and Townsend Khourie and Crew

[57] ABSTRACT

Magnetic shielding currents having a critical current density, Jc, at a superconducting temperature are stabilized by reducing the temperature of the superconducting body after a steady state or persistent current is established. The current density of the current at the reduced temperature is below the critical current density for the material at the reduced temperature. Decay of the magnetic shielding current at the reduced temperature is significantly reduced.

7 Claims, 6 Drawing Sheets

METHOD OF REDUCING DECAY OF MAGNETIC SHIELDING CURRENT IN HIGH $T_c$ SUPERCONDUCTORS

BACKGROUND OF THE INVENTION

This invention relates generally to superconductors, and more particularly the invention relates to improving the operating stability of superconductors by reducing decay of magnetic shielding current.

The so-called high temperature superconductors are materials such as copper oxides (e.g. 1-2-3 compounds) which exhibit superconducting characteristics when cooled with liquid nitrogen (boiling point of 77° k). While high temperature superconductors offer much promise for commercial applications since the need for expensive and difficult to use helium is obviated, a serious problem has been recognized regarding a magnetic flux lattice weakness which results in a decay of magnetic shielding current. See Pool "Superconductivity: Is the Party Over?," *Science*, May 1989. As noted therein, the unexpected weakness of magnetic flux lattice means that high temperature superconductors may not be able to hold a high enough magnetic field in the "persistent current" mode to perform many of the tasks once envisioned for them. In many applications the superconductors are used in the so-called persistent current mode. A constant DC current flow is maintained inside the superconductor without the need of an external power supply. The lack of electrical loss in the superconductor makes such an operation possible. An important criterion of a superconductor is the critical current density $J_c$, or maximum amount of current the DC superconductor can carry before it becomes lossy electrically. Persistent currents can be established in a variety of ways; but in all previously used methods the electrical critical current density, $J_c$, is reached in at least some portions of the circuit. It has been found that in all the high T materials operation near the critical current density results in electrical loss so that the persistent current decays significantly over useful periods of time. Typical decay can 10 be 10–20% over the first 1000 seconds which limits practical utilization. It is recognized that when the high $T_c$ superconductors are operated near their critical current density the persistent currents decay significantly over time due to the undesirable loss in the superconducting material. Typical relaxation causes a large amount of decay in the persistent current (on the order of 10–20% for the first 1000 seconds) which limits the practical utilization of the material.

High $T_c$ superconductors are the so called type II superconductors. Inside such superconductors, magnetic fields do not spread uniformly but form in lines of quantized flux, called fluxoids. Electric currents passing through the superconducting material push against the lines of flux, and if they move energy is dissipated. The dissipation of energy appears as electrical resistance which defeats the purpose of the superconductor. When the force of the electrical current pushing against the fluxoids becomes large enough, the fluxoids aided by thermal energy start creeping over defects. This creep also represents loss that appears as electrical resistance.

SUMMARY OF THE INVENTION

An object of the present invention is a method of stabilizing the persistent current in a superconductor. Another object of the invention is a method of reducing decay of magnetic shielding current in high $T_c$ superconductors.

A feature of the invention is a temperature reduction process to keep the shielding current slightly below the critical current density, Jc, resulting in reduced relaxation of the shielding current and its induced magnetic moment.

In one embodiment of the invention a magnetic shielding current with a density $J_c(T_1)$ is established in a $Y\ Ba_2\ Cu_3\ O_7$ film at a temperature, $T_1$. Once the current is established, the temperature of the superconductor is reduced to $T_2$; thereby increasing the critical current density to $J_c(T_2)$; the shielding current circulating in the superconductor now being below the critical current density. By keeping the current slightly below the critical current density, the relaxation is dramatically reduced.

One method of achieving the process by which the temperature is rapidly reduced from $T_1$ to $T_2$ is suddenly to reduce the pressure over the cryogenic fluid (for example liquid nitrogen or liquid from) in which the superconducting material is immersed. The persistent current which previously could have been established in any number of well known methods thereby is no longer as close to $J_c$ by virtue of the latter having been increased from $J_c(T_1)$ to $J_c(T_2)$.

The invention and objects and features thereof will be more readily apparent from the following detailed description and appended claims when taken with the drawing.

DETAILED DESCRIPTION OF ILLUSTRATIVE EMBODIMENTS

Figure 1:
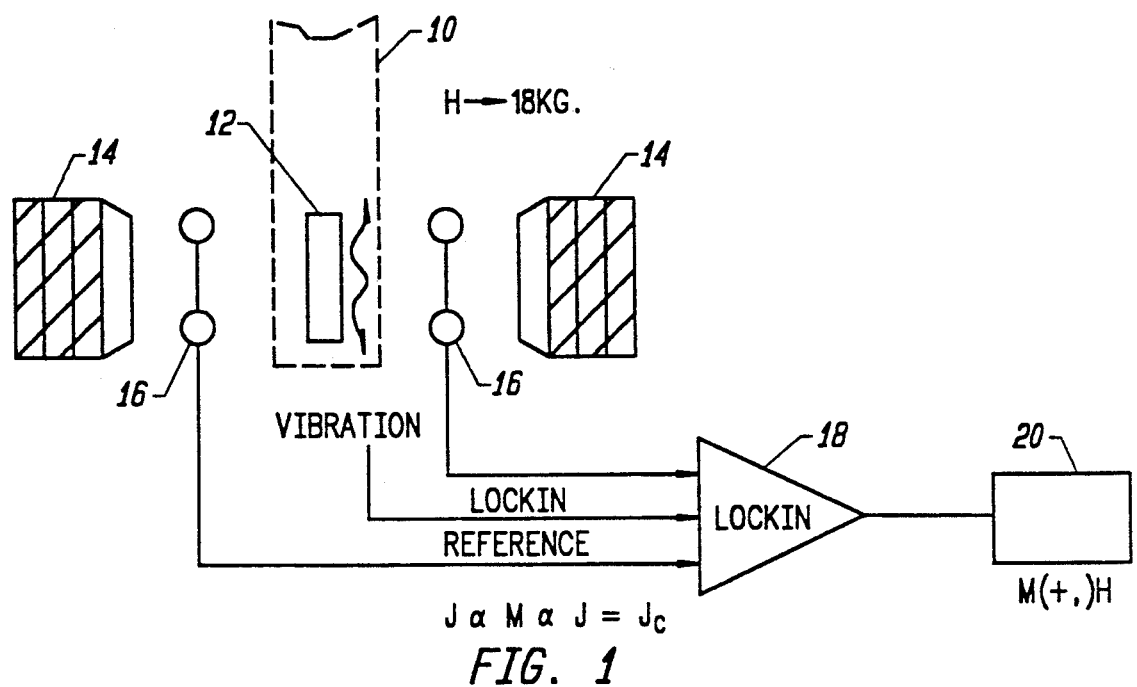
FIG. 1 is a schematic diagram of circuitry for establishing and detecting magnetic shielding currents in a superconducting material.

FIG. 1 is a schematic diagram illustrating apparatus for establishing current in a superconducting body. A container 10 housing liquid nitrogen under slight pressure also holds a superconducting body 12 such as a thin film of 1-2-3 compound material grown on a substrate such as magnesium oxide. The container 10 and the body 12 are inserted between two large magnet poles 14 which establish a strong uniform magnetic field up to approximately 18 kilogauss. Coils 16 measure the induced magnetic shielding currents in the magnetic film in the superconducting body 12. Since the magnetic moment established in the superconductor body is DC, the container is vibrated at a very low frequency (e.g. 79Hz) so that the coils 16 can detect a varying or alternating magnetic moment. The vibration frequency is applied as a lock-in reference frequency to the lock-in amplifier 18. Accordingly, only the magnetic moment at this frequency is detected from the coils 16, and extraneous frequencies are not detected. Meter 20 provides a reading of the magnetic moment from the amplifier 18.

Figure 2A:
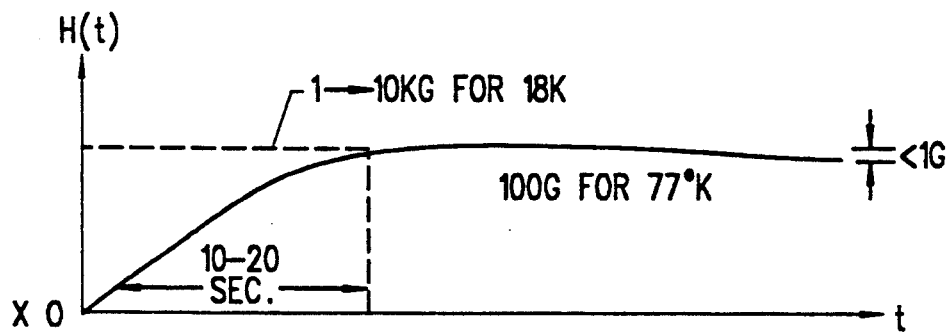
FIGS. 2A, 2B, and 2C are curves illustrating magnetic field versus time, magnetic moment versus time with current at the critical current density, and magnetic moment versus time with current below the critical current density in accordance with the invention.
Figure 2B:
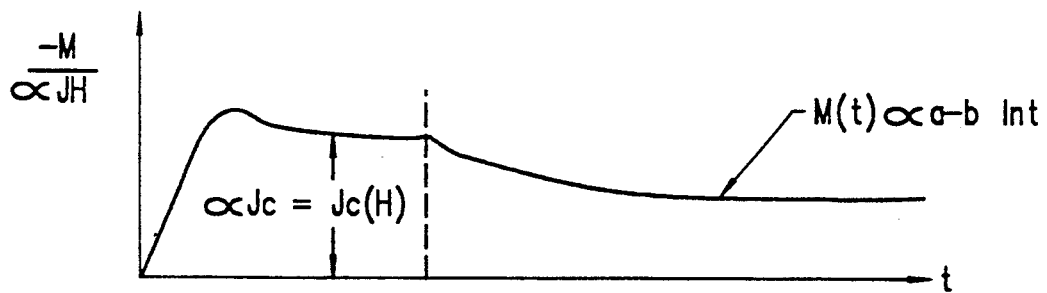

FIG. 2A is a plot of the magnetic field that produced the induced magnetic shielding currents in the superconductor. It is noted that the magnetic field ramps up to a steady state over a period of 10-14 20 seconds. FIG. 2B is a plot of the magnetic moment which is proportional to the current inside the superconductor. It will be noted that the magnetic moment reaches a steady state which is proportional to the critical current density in the superconducting material. Once the magnetic field becomes steady state, it will be noted that the magnetic moment decays with time. This is the relaxation of the shielding current induced moment heretofore recognized as a limitation in the commercial application of 1-2-3-compound superconductor materials.

Figure 2C:
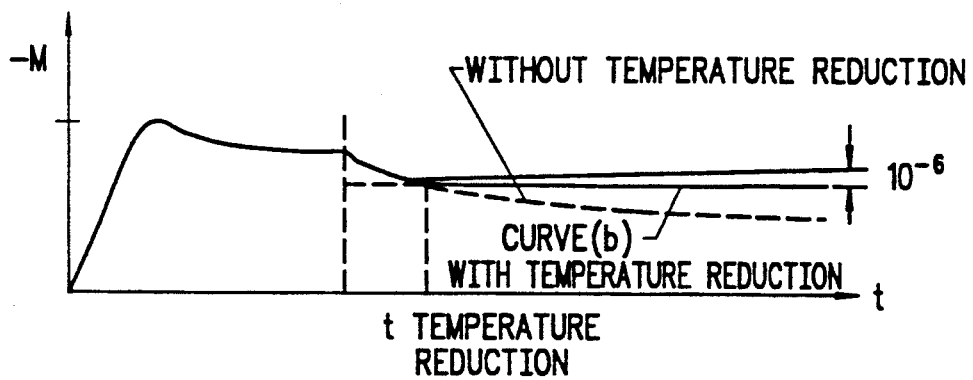

FIG. 2C is a plot of the magnetic moment versus time when the magnetic material is quenched in accordance with the present invention. More particularly, after the magnetic moment reaches a steady state and before it begins decaying, the temperature of the superconductor material is reduced slightly thereby increasing the critical current density for the material. By keeping the shielding current slightly below the critical current density, the relaxation is dramatically reduced, as can be seen for curve b.

Figure 3:
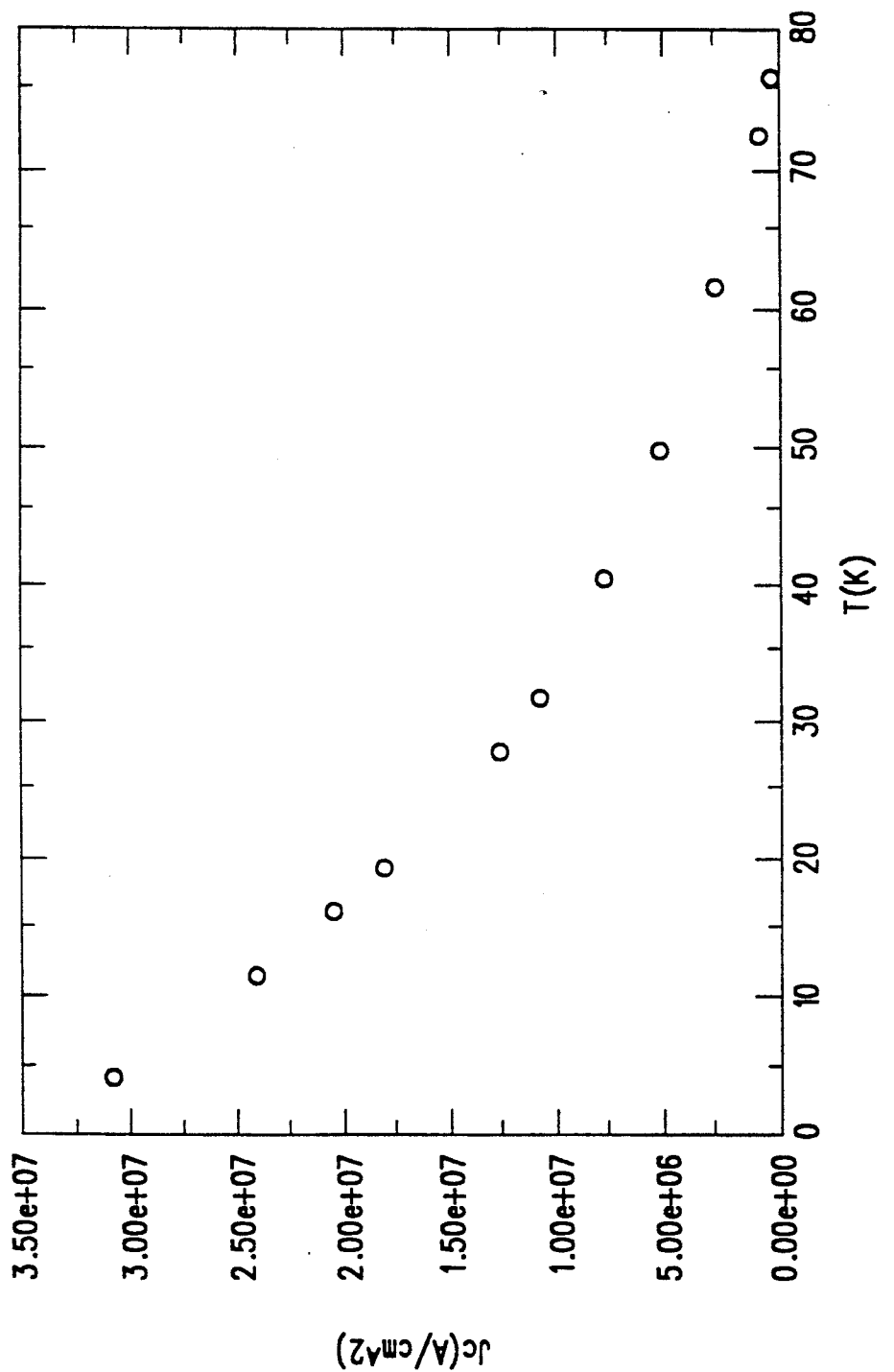
FIG. 3 is a plot illustrating typical temperature dependence of the critical current density.

A general relation between the relaxation rate at Jc and the reduction of the relaxation rate upon the lowering of the operating temperature has been obtained theoretically and demonstrated experimentally. Test samples of YBCO where grown exitaxially on (100) MgO substrate using in situ sputter deposition from a stoichiometric YBCO target with the off-axis geometry. These films typically have a size of $\frac{1}{4}'' \times \frac{1}{4} \times 4000_p$ with a $T_c$ of 86 K measured from transport measurement. Structural studies confirmed that these films are highly textured with the c-axis of the YBCO cell perpendicular to the surface of the film. The critical current density Jc was obtained through the Bean critical state model by measuring the magnetic hysteresis on a modified Princeton Applied Research 155 vibration sample magnetometer with fields up to 18 kG applied perpendicular to the surface of the film. The validity of the critical state model has been examined carefully and agreement between the transport and magnetically measured Jc was confirmed in the low current density limit. The Jc at 6 kG thus obtained is shown in FIG. 3 as a function of temperature.

Figure 4:
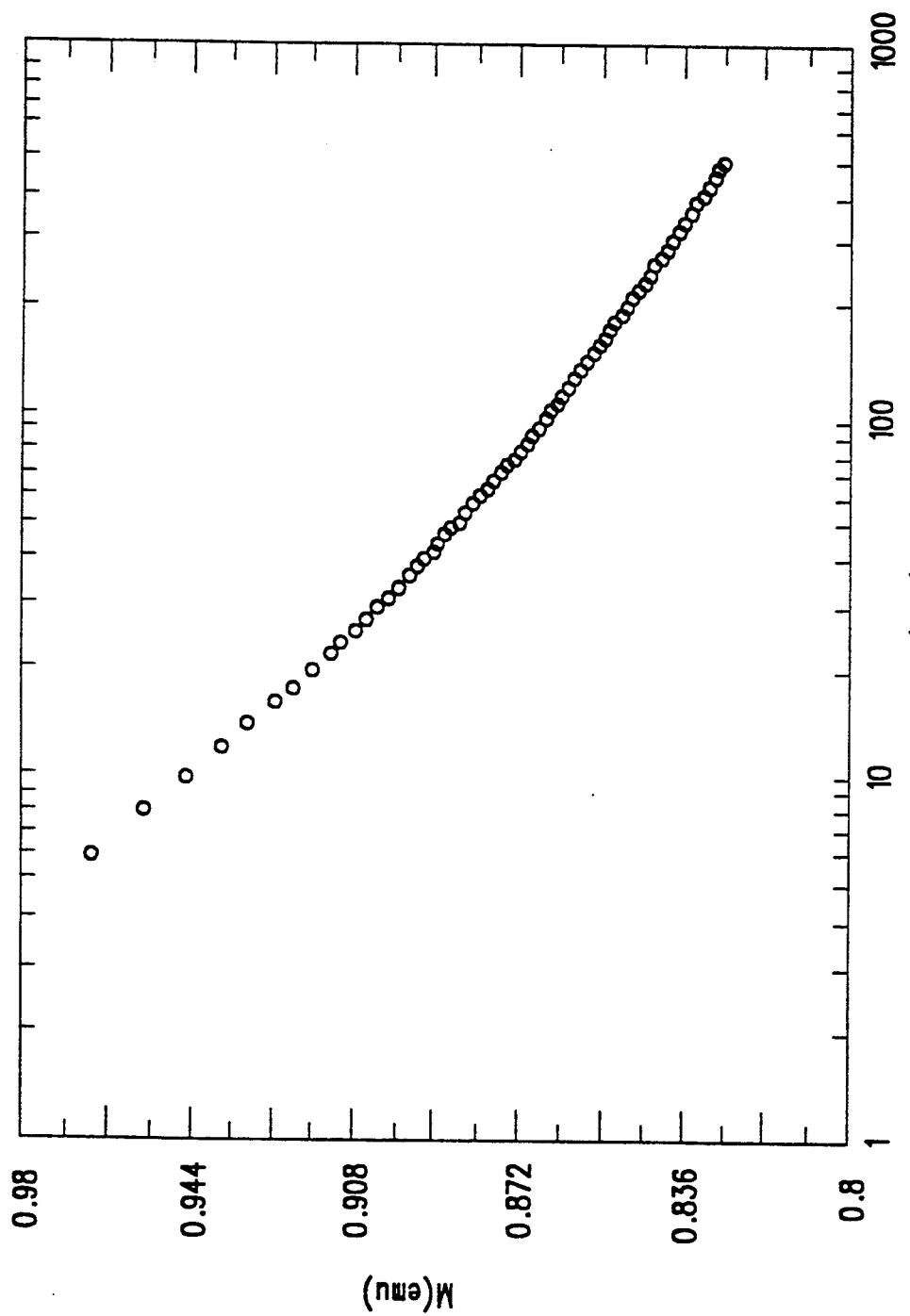
FIG. 4 is a plot illustrating the decay of magnetic shielding current.

The decay of the magnetic shielding current was studied by first ramping the magnetic field to a certain value to saturate the sample into its critical state and then immediately after recording the magnetic moment generated by the shielding current as a function of time. A typical set of such data is shown in FIG. 4 which was taken at 6kG. As can be seen, the decay rate is roughly logarithmic which can be rather well described by the relation of $$M(t) \approx M(0)\left[1 - \frac{1}{n-1} \ln\left(\frac{t}{\tau_1} + 1\right)\right] \quad (1)$$

with M(0) the initial moment and n the exponent reflecting the rate of relaxation. We have shown elsewhere that (1) follows from the power-law-like current-voltage (J-E) characteristic $$E = \alpha J^n \quad (2)$$

which describes the behavior of our samples. The time scale $\tau_1$ is determined by $$\tau_1 \approx \frac{\pi l a^3 \Lambda}{3 c M^{n-1}(0)\alpha(n-1)} \quad (3)$$

with l the sample thickness, a the sample radius (assuming the sample is a round disk), c the speed of light, and $\Lambda = 4a^2/c^2$. M(0) is the initial moment that relates to the critical current density through the Bean formula $$J_c = \frac{3c}{\pi l a^3} M(0) \quad (4)$$

which also relates J(t) to M(t) as long as the current distribution inside the sample is uniform.

Figure 5:
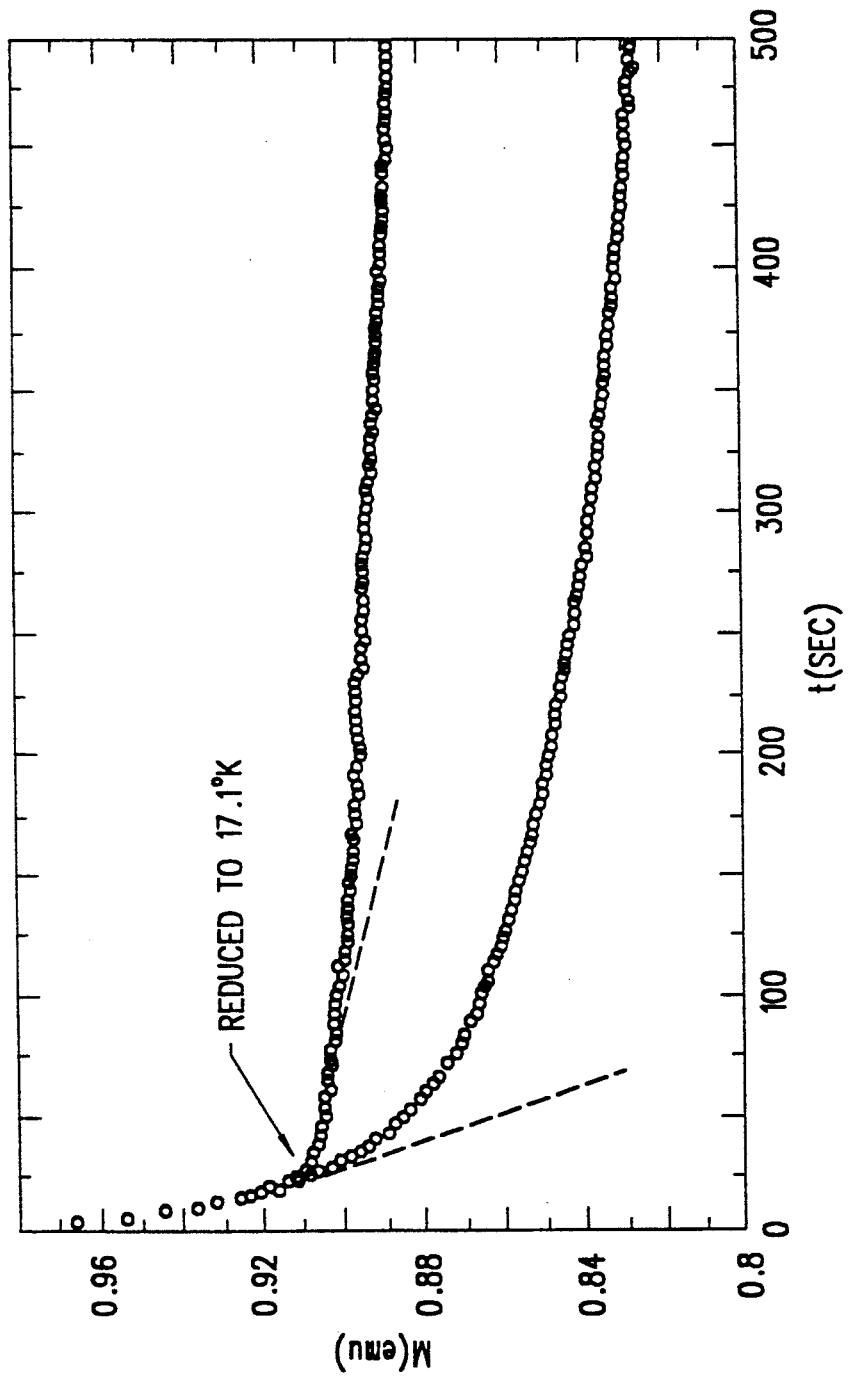
FIG. 5 illustrates isothermal relaxation of magnetic shielding current.

Since the sample is in its critical state the shielding current is pushed all the way up to the critical current density everywhere. To see how much effect a reduction of the shielding current will have upon the relaxation process, a shielding current of the value less that Jc has to be set up. This is done by first driving the sample into its critical state at a certain temperature $T_1$, and then after a well defined period of time $t_1$, suddenly cooling the sample to another temperature $T_2 < T_1$. The decrease of temperature causes an increase in the critical current density, as can be obviously seen from FIG. 3. However, the shielding current is set up before the increase of Jc and is therefore trapped inside the sample with its value below the now increased Jc. This operation results in great reduction of the relaxation rate. FIG. 5 demonstrates the result by comparing two decay curves with one taken at 19.2 K all the way out to 500 seconds and the second reduced down to 17.1 K 24 seconds after the shielding current was set up at 19.2 K. The temperature L variation is completed in about 5 seconds and the variation was made without under shooting of the temperature.

As can be seen from the plot, the relaxation rate dM/dt at the point of $t_1$ is reduced by about a factor of ten. From FIG. 1 it is estimated that such a decrease of temperature increases Jc by only 7.5%, yet its effect on the relaxation is already very significant.

To see how this can be we return to (1). It can be shown that (1) is the linearized solution of the simplified relaxation equation $$\Lambda \frac{dJ}{dt} \approx -E = -\alpha J^n \quad (5)$$

with the initial condition of $$J(t=0) = Jc \quad (6)$$

It is obvious that what the experiment does is simply change the prefactor $\alpha$ in (5) and the initial condition (6) at time $t_1$ (here we assume that the exponent is not a sensitive function of temperature. This is true for YBCO in the temperature region of concern). At $t_1$, the relation (5) is changed to $$\Lambda \frac{dJ}{dt} \approx -\alpha' J^n = -\alpha \eta^n J^n \quad (t \geq t_1) \tag{7}$$

with $\eta$ defined as the operation level which is the ratio between the real shielding current density $J$ (which is close to the $J_c$ before quench) and the critical current density after quench, $J_{cQ}$:

$$\eta = \frac{J}{J_{cQ}} \approx \frac{J_c}{J_{cQ}} \tag{8}$$

with the initial condition (6) changed to $$J(t = t_1) \approx J(0)\left[1 - \frac{1}{n-1}\ln\left(\frac{t_1}{\tau_1} + 1\right)\right] \tag{9}$$

This analysis is limited to situations with $1 - \eta \ll 1$ since a rather uniform current distribution within the sample is required for the validity of Eqn. (5). Assuming so, it is easy to see that this change yields a result that is nothing more than (1) with a shift of origin in time and a modification on the time denominator $\tau_1$:

$$M(t) \approx M(t_1)\left[1 - \frac{1}{n-1}\ln\left(\frac{t}{\tau_2} + 1\right)\right] (t \geq t_1) \tag{10}$$

with $$\tau_2 = \frac{1}{\eta^n\left[1 - \frac{1}{n-1}\ln\left(\frac{t_1}{\tau_1} + 1\right)\right]^{n-1}} \tau_1 \tag{11}$$

To compare the relaxation rate before and after temperature reduction we define $$R_- = \frac{dM}{dt}\bigg|_{t=t-1} \tag{12}$$

to be the slope before reduction at $t_1$ and $$R_+ = \frac{dM}{dt}\bigg|_{t=t+1} \tag{13}$$

to be the slope after reduction at $t_1$. It immediately follows that the ratio of reduction of the relaxation rate $$\frac{R_-}{R_+} \approx \frac{\tau_2}{t_1} = \frac{\tau_1}{t_1}\frac{1}{\left[1 - \frac{1}{n-1}\ln\left(\frac{t_1}{\tau_1} + 1\right)\right]^{n-1}}\left(\frac{1}{\eta^n}\right) \tag{14}$$

Since $R_-/R_+$ has to equal to one when $n=1$ (i.e., the case of no quench), it is obvious that $$\frac{R_-}{R_+} \approx \left(\frac{1}{\eta}\right)^n \tag{15}$$

From our time dependence data we obtain $\eta = 38$, $\eta = 0.925$ for the example shown in FIG. 5. With these parameters (15) predicts that the reduction of the relaxation rate will be of the order 20. This is compared with the actual experimental result of around 10. Considering the fact that it is difficult to determine the accurate value of $\eta$ (since the final result depends so sensitively on it) and that the process is really not a transient process, the agreement is reasonable.

Figure 6:
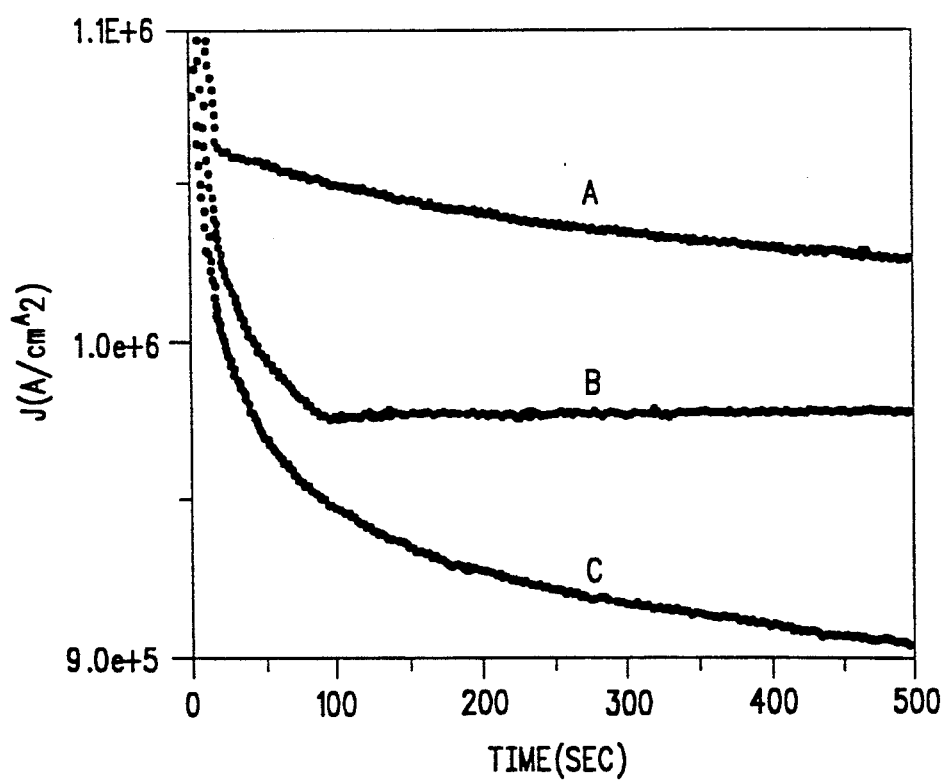
FIG. 6 is a plot illustrating decay of magnetic shielding current with different quench history.

Further experiments were carried out at liquid nitrogen temperature. The sample was cycled into the critical state from 400 Gauss to 40 Gauss of applied field at a temperature $T_1 = 78.0$ K, allowed to decay for time $t_1$, and then reduced to a lower temperature $T_2 = 77.5$ K. Temperature reduction in this temperature region was accomplished by depressurizing a small nitrogen bath FIG. 6 illustrates this process for $t_1 < 500$ sec (no reduction) and $t_1 = 80$ sec, respectively. Variations in the decay rate before temperature reduction are due to small differences (<0.05 K) in starting temperature. As can be seen in the FIGURE, a dramatic decrease in the decay rate is accomplished by this relatively small (0.5 K) change in temperature. A temperature reduction at $J = 1.05 \times 10^6$ A/cm$_2$ results in a 40-fold decrease in the decay rate, while a temperature reduction at $J = 0.98 = 10^6$ A/cm$_2$ causes the decay rate to fall below our instrumental stability.

Figure 7:
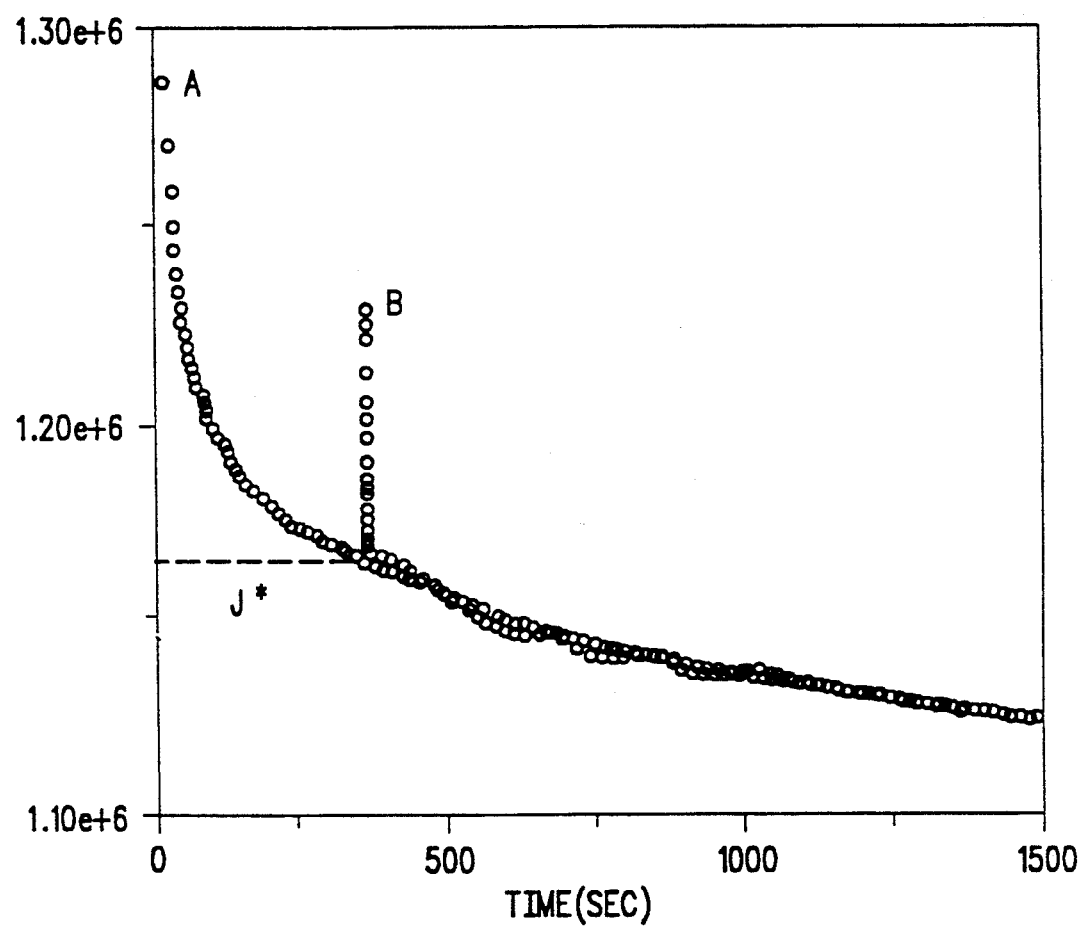
FIG. 7 is a plot illustrating the relaxation behavior with two different initial conditions at T = 350 seconds.

The decay occurring right after reduction down to 77.5 K is well described by the solution (10). Shown in FIG. 7 are two relaxation curves. Curve A is the isothermal decay at 77.5 K while curve B is reduced from 78 K to 77.5 K at the current density J*. It can easily be seen that the relaxation of curve B thereafter follows that of curve A with a shifted time origin that accounts for the initial condition J*, just as predicted by (10). Extrapolating this model, it is expected that rate of current decay present in the sample after the temperature reduction at 80 sec shown in FIG. 6 is 1.0. This level of stability would be obtained without a reduction only after 20,000 sec at 77.5 K, according to (7).

Therefore, the relaxation of magnetic shielding current can be greatly reduced and effectively eliminated if the superconductor is operated at current levels slightly below the critical current density. Since the reduction of the relaxation depends on the operating current reduction level $\eta$ with a very large power exponent n, such improvements can be made without great sacrifice of the utility of the critical current and is not a serious problem for persistent current applications. A convenient way of achieving this condition, as has been demonstrated, is to simply reduce the operating temperature slightly after the sample enters its critical state.

While the invention has been described with reference to a specific embodiments, the description is illustrative of the invention and is not to be construed as limiting the invention. For example, the persistent current can be established in a coil by the conventional method of ramping a current through the coil or solenoid and then activating a persistent current switch which shorts the power supply. Various modifications and applications may occur to those skilled in the art without departing from the true spirit and scope of the invention as defined by the appended claims.

We claim:

1. A method of increasing the stability of persistent current in a high temperature ceramic superconducting body having nonlinear superconducting current-voltage characteristics and a critical current density that is temperature dependent comprising step of
  a) cooling said superconducting body to a temperature where superconductivity can exist,
  b) establishing a current in said superconducting body that reaches a critical current density, Jc, at least locally, and
  c) reducing the temperature of said superconducting body thereby increasing the critical current density whereby said current has a current density below said critical current density at the reduced temperature.

2. The method as defined by claim 1 wherein step (a) includes cooling said superconducting body in a liquid coolant under pressure, and step (c) includes reducing said pressure.

3. The method as defined by claim 2 wherein said liquid coolant comprises liquid nitrogen.

4. The method as defined by claim 2 wherein step (b) includes magnetically inducing said current in said superconducting body.

5. The method as defined by claim 4 wherein said current is a magnetic shielding current.

6. The method as defined by claim 1 wherein said superconducting body comprises a yttrium barium copper oxide.

7. The method as defined by claim 2 wherein step (b) includes electrically inducing said current by ramping and external power supply connected to said superconducting body and shorting said power supply whereby persistent current is obtained.

* * * * *